United States Patent
Cho et al.

(10) Patent No.: US 7,026,639 B2
(45) Date of Patent: Apr. 11, 2006

(54) PHASE CHANGE MEMORY ELEMENT CAPABLE OF LOW POWER OPERATION AND METHOD OF FABRICATING THE SAME

(75) Inventors: Seong Mok Cho, Daejeon (KR); Sangouk Ryu, Daejeon (KR); In Kyu You, Daejeon (KR); Sung Min Yoon, Daejeon (KR); Kwi Dong Kim, Daejeon (KR); Nam Yeal Lee, Daejeon (KR); Byoung Gon Yu, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 260 days.

(21) Appl. No.: 10/737,071

(22) Filed: Dec. 15, 2003

(65) Prior Publication Data
US 2004/0203183 A1    Oct. 14, 2004

(30) Foreign Application Priority Data
Apr. 12, 2003    (KR) ............... 10-2003-0023213

(51) Int. Cl.
*H01L 29/00* (2006.01)
*H01L 21/00* (2006.01)
*G11C 11/00* (2006.01)

(52) U.S. Cl. .............. 257/3; 257/4; 365/148; 438/800

(58) Field of Classification Search .............. 257/3, 257/4; 438/800; 365/148
See application file for complete search history.

(56) References Cited

U.S. PATENT DOCUMENTS

| | | | |
|---|---|---|---|
| 3,827,033 A * | 7/1974 | Quilliam ............... 365/163 |
| 3,918,032 A * | 11/1975 | Nicolaides ............... 257/3 |
| 5,335,219 A | 8/1994 | Ovshinsky et al. |
| 5,761,115 A * | 6/1998 | Kozicki et al. ........... 365/182 |
| 5,896,312 A * | 4/1999 | Kozicki et al. ........... 365/153 |
| 5,914,893 A * | 6/1999 | Kozicki et al. ........... 365/107 |
| 5,933,365 A | 8/1999 | Klersy et al. |
| 6,084,796 A * | 7/2000 | Kozicki et al. ........... 365/153 |
| 6,225,142 B1 | 5/2001 | Reinberg |
| RE37,259 E | 7/2001 | Ovshinsky |
| 6,512,241 B1* | 1/2003 | Lai ............... 257/4 |
| 2004/0233769 A1* | 11/2004 | Matsuoka et al. ........ 365/232 |
| 2004/0248339 A1* | 12/2004 | Lung ............... 438/102 |
| 2004/0256610 A1* | 12/2004 | Lung ............... 257/4 M |

* cited by examiner

*Primary Examiner*—Evan Pert
(74) *Attorney, Agent, or Firm*—Blakely Sokoloff Taylor & Zafman

(57) ABSTRACT

Provided is a phase-change element capable of operating with low power consumption and a method of manufacturing the same. The phase-change element comprises a first electrode used as a heating layer, a second electrode, which is laterally disposed adjacent to the first electrode, and a memory layer made of a phase-change material located between and contacting the side surfaces of the first electrode and the second electrode.

18 Claims, 5 Drawing Sheets

PHASE CHANGE MEMORY ELEMENT CAPABLE OF LOW POWER OPERATION AND METHOD OF FABRICATING THE SAME

BACKGROUND OF THE INVENTION

This application claims the priority of Korean Patent Application No. 2003-23213 filed on Apr. 12, 2003, in the Korean Intellectual Property Office, the disclosure of which is incorporated herein in its entirety by reference.

1. Field of the Invention

The present invention relates to a memory element, and more particularly, to a phase-change memory element utilizing characteristics of the phase change of materials and to a method of fabricating the same.

2. Description of Related Art

A phase-change memory device stores information utilizing the electrical conductivity difference between a crystalline phase and an amorphous phase of a specific material. A phase-change memory device is formed with a semiconductor substrate which is equipped with a transistor element or a diode element for addressing and a read/write operation, and these elements are electrically connected with a phase-change region. Because information is stored utilizing the conductivity difference from a phase-change, data is stored as a characteristic of the phase-change memory element including the phase-change region.

Looking into the operation of phase-change memory device, a current flow through a transistor or a diode heats the phase-change region. Then, by a reversible transformation of the structure of the phase-change material between a crystalline phase and an amorphous phase, information is stored, and then the stored information is read by detecting the resistance of the phase change material by a relatively low current flow.

Up to now, the most difficult technical problem for the embodiment of the phase-change memory element has been the excessive power consumption for a writing operation, especially, when there is a transformation from a crystalline phase to an amorphous phase; that is, a reset operation requires heating the phase-change material beyond the melting point. The most serious problem in this matter is that the integration capability of the phase-change memory is confined in association with the fact that the smaller the size of transistor element for the action of phase-change element, the smaller the power transmission through the transistor element to the phase-change memory element.

In order to have the phase-change memory element operating with a low current, it is necessary to reduce the volume of the phase-change region of the element as much as possible, and to improve the thermal isolation of the phase-change region. In this direction, various structures of a phase-change element for operating with a low current have been studied.

For example, according to U.S. Pat. No. 5,933,365 ("Memory element with energy control mechanism", by Patric Klersy et al, registered on Aug. 3, 1999), a lower electrode used as the heating layer contacts a memory layer, that is, a phase-change layer within a contact hole. Accordingly, the phase-change layer contacts the lower electrode, practically, at the bottom of the contact hole, and a phase change takes place on such contacting surface. In this structure of an element, it is possible to reduce the volume of the phase-change field but the volume of the phase-change field is ultimately limited by the resolution of the photo lithography process which is under gone to form the contact hole. Therefore, for a highly integrated memory element, the power that is consumed could still remain as a problem.

Also, in U.S. Pat. No. 5,687,112 ("Multibit single cell memory element having tapered contact", by Stanford R. Ovshinky et al, registered on Nov. 11, 1997), a structure for reducing the phase-change field was suggested. According to them, a tapered contact tip is prepared, and the tip of the tapered contact tip is arranged to contact the memory layer and the phase-change layer. In spite of this approach, since the volume of the phase-change field could change excessively even with a minute variation in the contact surface, securing the uniformity of the element's characteristics could be very difficult.

Therefore, the development of a phase-change memory element having a stabilized structure which secures the uniformity and reproducibility for a manufacturing process and is capable of operation with a low power is still required.

SUMMARY OF THE INVENTION

The present invention provides a phase-change memory element capable of operation with a low power and a method of manufacturing the same having a simple process for the improvement in the uniformity and reproducibility.

In accordance with an aspect of the present invention, there is provided a phase-change memory element minimizing the volume of a phase-change field and having improved uniformity. The phase-change memory element comprises a first electrode used as a heating layer, a second electrode whose side surface faces a side surface of the first electrode in a sideways direction (i.e. the first and second electrodes are laterally disposed adjacent one another with a gap between a side surface of the first electrode and a side surface of the second electrode; and a memory layer located between the side surfaces of the first electrode and the second electrode and is made of a phase-change material contacting at least the side surface of the first electrode.

Here, the first electrode and the second electrode could be formed of a material having the same conductivity. For example, the first electrode can be formed a material from the group of titanium aluminum nitride, titanium silicon nitride, or titanium carbon nitride. The first electrode and the second electrode could have the same thickness and have an equivalent height.

The first electrode can be formed to have narrow width portion protruding toward the side surface of the second electrode located opposite to the first electrode, and contacting the memory layer.

A chalcogenide alloy can be used as the phase change material.

The above memory layer could have formed as a ring shape with its two opposite side surfaces in contact with the side surfaces of the first electrode and the second electrode, respectively.

The phase-change memory element further comprises the first interconnection contact connecting the first electrode to a semiconductor substrate electrically and the second interconnection contact connecting the second electrode to an upper electric line electrically.

The phase-change memory element further comprises a first electrode pad between the first electrode and the first interconnection contact and having a thicker thickness than the first electrode and is placed, and a second electrode pad having the same height and thickness as the first electrode pad under the second electrode.

A method of manufacturing the phase-change memory element comprises: forming an electrode layer pattern on a first insulating layer; forming a second insulating layer covering the electrode layer pattern; forming a contact hole, through the second insulating layer and the electrode layer pattern that dividing the electrode layer pattern into a first electrode, which is used as a heating layer, and a second electrode layer, which sidely is opposite to the first electrode; and forming a memory layer with a phase-change material contacting the side surfaces of the first electrode and the second electrode, which are exposed by the contact hole, in the contact hole.

Here, the steps of forming an electrode layer pattern comprises: forming the electrode layer pattern on the first insulating layer; and patterning the electrode layer so that a portion of the electrode layer pattern between the first electrode and the second electrode to the first electrode layer side has narrower width than that of the second electrode; and the contact hole is formed to cross secting the narrowed width portion and allows the cross sected surface of the narrow width portion to contact with the memory layer.

Prior to the formation of the electrode layer, a first electrode pad and a second electrode pad, respectively aligned to the first electrode and the second electrode on the first insulating layer could be formed.

The method of forming the first electrode pad and the second electrode pad comprises: forming an electrode pad layer on the first insulating layer; and patterning the electrode layer pattern to form the first electrode pad and the second electrode pad.

Prior to the formation of the electrode layer, a connection between an interconnection contact, which electrically connects a semiconductor substrate thereunder, and the first electrode can be further formed through the first insulating layer.

The method of forming a memory layer comprises at least: forming the memory layer contacting the side wall of the contact hole; and patterning the memory layer by the CMP process to expose the upper surface of the second insulating layer.

The method of forming the memory layer comprises at least: forming the memory layer contacting the side wall of a contact hole and following the profile of the contact hole; and patterning the memory layer to have a circular shape on the wall of the contact hole by exposing the bottom of the contact hole.

The method of forming the memory layer further comprises patterning the memory layer by etching back process.

After forming the memory layer, a step for forming a third insulating layer on the second insulating layer, and another step for forming an upper electric line on the third insulating layer for connecting electrically to the second electrode could be further performed.

According to the present invention, a phase-change memory element having a minimum volume of a phase-change region and having a higher uniformity in reproducibility can be provided.

BRIEF DESCRIPTION OF THE DRAWINGS

The above and other features and advantages of the present invention will become more apparent by describing in detail a preferred embodiment thereof with reference to the attached drawings in which.

DETAILED DESCRIPTION OF THE INVENTION

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art.

Hereafter, the embodiments of the present invention shall be described in detail with the accompanying drawings. According to the embodiments of the present invention, there is provided a phase-change memory element where the first electrode used as a heating layer and the second electrode which is opposite to the first electrode are formed with layers of the same height, and a memory layer which is formed by a phase-change material placed between the side surface of the first and second electrodes which face each other.

For such a phase-change memory element, the contact surface between the first electrode used as a heating layer and the memory layer is dependent on the side width of the first electrode, while, the area of the side surface of the first electrode is determined by the width and the thickness of the first electrode, which will be formed during a patterning process. Accordingly, despite of the limitation of the patterning process, the contact surface of the first electrode could be formed with a very small with the aid of actually the thickness of the first electrode. The thin thickness of the first electrode can be realized during a deposition process beyond the limitation of the patterning process. Therefore, the volume of a phase-change region which is dependent on the contact surface can be very small, and accordingly a phase-change memory element operation using a low current is possible.

Now, the phase-change memory element and a method of manufacturing the same shall be described in detail according to the preferred embodiments of the invention.

FIGS. 1A through 7B are general views of a phase-change memory element and the method of manufacturing the same according to the first embodiment of the present invention.

Figure 1A:
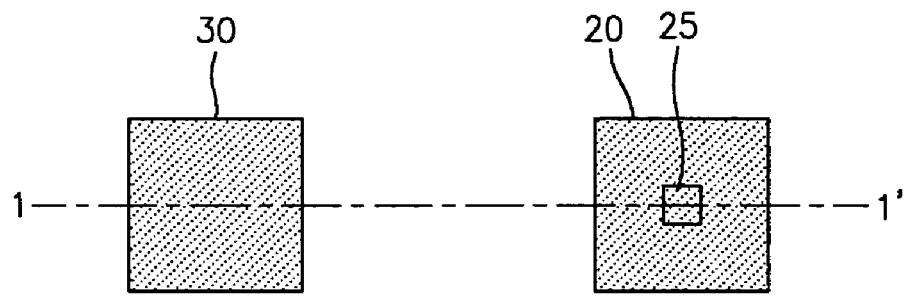
FIG. 1A and FIG. 1B, FIG. 2A and FIG. 2B, FIG. 3A and FIG. 3B, FIG. 4, FIG. 5A and FIG. 5B, FIG. 6, and FIG. 7A and FIG. 7B are general views of a phase-change memory element and the method of manufacturing the same according to the first embodiment of the present invention.
Figure 1B:
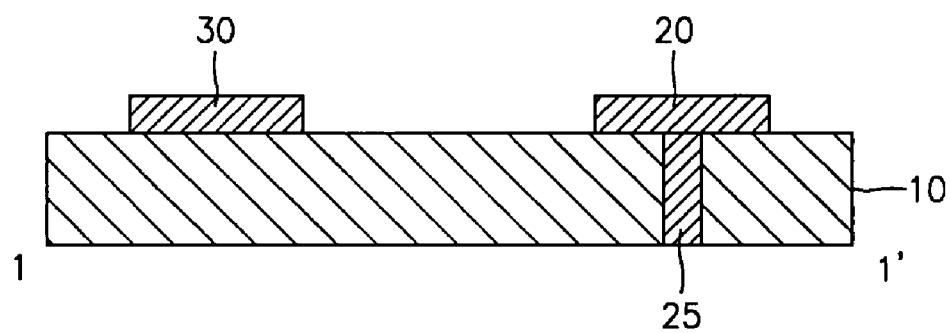

FIG. 1A is a plan view showing the step of forming the first electrode pad 20 and the second electrode pad 30 on a first insulating layer 10, and FIG. 1B is a cross sectional view according to a cutting-plane line 1–1' of FIG. 1A.

Referring to FIGS. 1A and 1B, the first insulating layer 10 is mounted on a semiconductor substrate (not shown) where a transistor element or diode element constituting a circuit for an addressing or memory operation. The integration of a transistor or diode on a semiconductor substrate for the operation of a phase-change memory element can be realized by a known process.

A first contact hole through the first insulating layer 10 is formed on the first insulating layer 10 using a photo lithography process in order to form an electrical connection with the circuit. Thereafter, a film of a conductive material, for example, a metal or other conductive material is deposited on the first insulating layer 10 and then a first interconnection contact 25 is formed to fill the first contact hole is etched back or flattened. The first connection contact 25 plays the role of an electrical connection between the first electrode and the transistor element.

The first interconnection contact 25 can be formed by a semiconductor process known as a plug process, however, it also can be formed by filling the first contact hole with an electrode pad layer in the deposition process of the pad layer followed by.

In a case when the first interconnection contact 25 is formed by a known plug process, the electrode pad layer is formed by the deposition of a metal or conductive film on the first connection contact 25 and the first insulating layer 10. The electrode pad layer can be formed of a different material from or the same material as that of the first interconnecting contact 25. Afterward, by means of patterning the electrode pad layer, the first electrode pad 20 and the second electrode pad 30, which is opposite to the first electrode pad 20, are formed. In this way, since the first electrode pad 20 and the second electrode pad 30 are formed in one process, the first electrode pad 20 and the second electrode pad 30 substantially have the same height facing sidely each other.

Figure 2A:
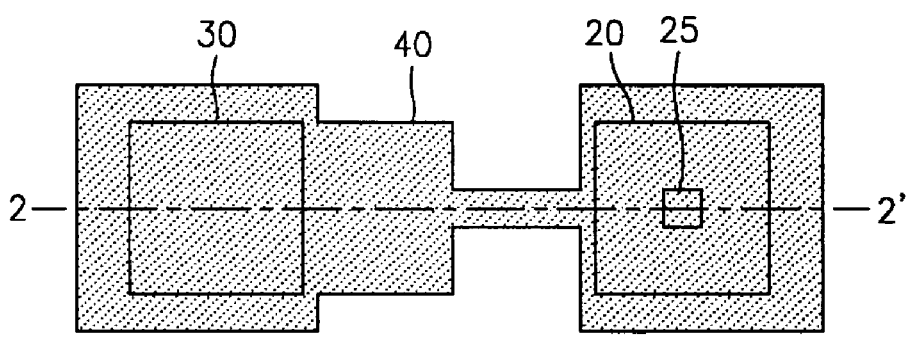
Figure 2B:
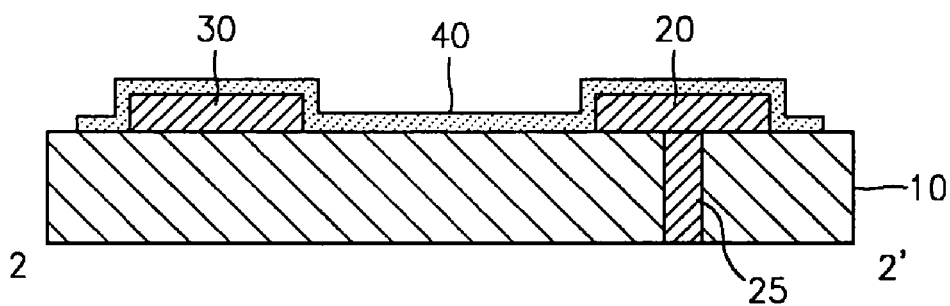

FIG. 2A is a plan view of an electrode layer 40 and FIG. 2B is a cross sectional view cut according to a cutting-plane line 2–2' of FIG. 2A.

Referring to FIGS. 2a and 2b, an electrode layer 40 is deposited to cover the first electrode pad 20 and the second electrode pad 30. Thereafter, the electrode layer 40 is patterned so that the portion of the electrode layer 40, which is between the first electrode pad 20 and the second electrode layer pad, has narrower width than the width of the first electrode pad 20 or the second electrode pad 30. This electrode layer 40 can work as a diffusion barrier layer, and can also be used as a heating layer for heating the phase-change material so as to cause phase change or transformation. Particularly, the portion deposited on the first electrode pad 20 works as the heating layer. The electrode layer 40 is formed of a conductive film, such as titanium aluminium nitride (TiAlN), titanium silicon nitride (TiSiN), or titanium carbon nitride (TiCN).

Meanwhile, as shown in FIG. 2A, it is preferable that patterning is performed such that the width of the electrode layer 40 between the first electrode pad 20 and the second electrode pad 30 is narrower than the width of the first electrode pad 20 or/and the second electrode pad 30. It is more preferable that the width sided to the first electrode pad 20 is narrower than that of the second electrode pad 30 side, since the electrode layer 40 existing above the first electrode pad 20 actually plays as a heating layer. In other words, the purpose of performing the above process is to make the volume of the phase change region small enough to confine to the contacting surface between the first electrode, which will be formed of a part of electrode layer 40, and the phase change material by allowing more current to concentrate onto the portion of the electrode layer 40 covering the first electrode pad 20 than the contacting surface of the phase change layer, that is, the memory layer.

Figure 3A:
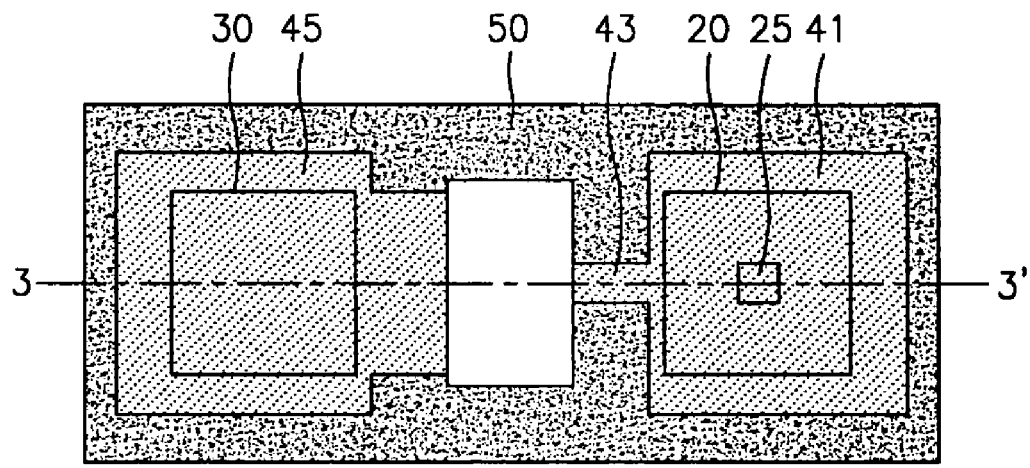
Figure 3B:
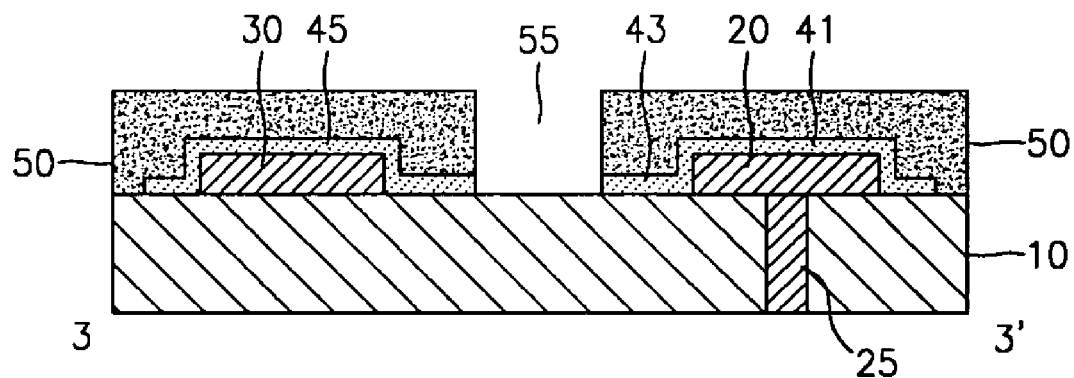

FIG. 3A is a plan view explaining the step of dividing the electrode layer 40 and FIG. 3B is across sectional view according to the cutting plane line 3–3' of FIG. 3A.

Referring to FIGS. 3A and 3B, a second insulating layer 50 is formed on the electrode layer 40, and a second contact hole 55 is formed on the electrode layer 40 using the photolithography process. The second contact hole 55 is formed to expose a portion of the first insulating layer 10 between the first electrode pad 20 and the second electrode pad 30 so as to separate the electrode layer 400 in FIG. 2A into the first electrode 41 located on the first electrode pad 20 and the second electrode 45 located on the second electrode pad 30.

For complete separation, the width of the second contact hole 55 is formed wider than the electrode layer 40 portion between the first electrode pad 20 and the second electrode pad 30. Here, as shown in FIG. 3A, a side surface of the first electrode 41 is exposed as a portion of side wall of the second contact hole 55. The side surface of the narrow width portion 43 of the first electrode pad 20 side of the electrode layer 40 is exposed the side wall of the second contact hole 55.

While the material used for the second insulating layer 50 mentioned above, it is preferable to be formed of a silicon oxide layer (SiO$_2$), which has good coherence, for semiconductor manufacturing process, and in order to obtain a higher thermal insulating characteristic, a low thermal conductivity material such as BPSG, could be used.

Figure 4:
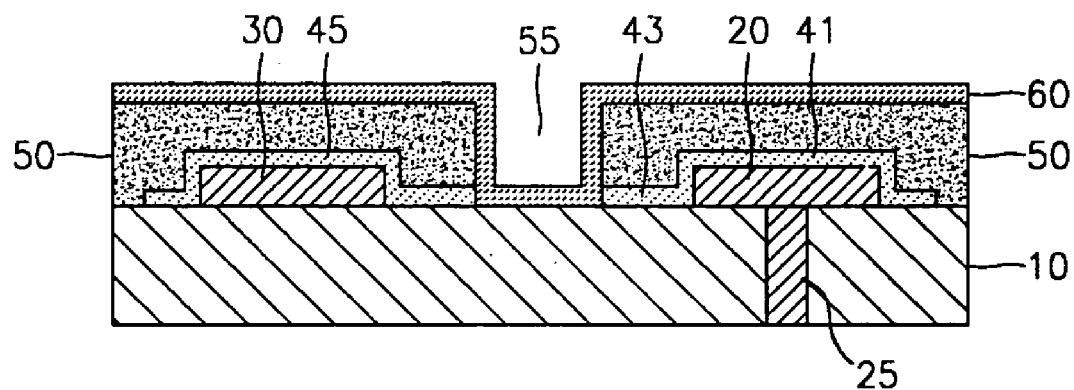

FIG. 4 is a cross-sectional view showing the step of depositing of a memory layer 60 between the first electrode 41 and the second electrode 45.

Referring to FIG. 4, a memory layer 60 is formed in the second contact hole 55 by depositing a phase-change material so as to contact the first electrode 41 and the second electrode 45 which are exposed to the second contact hole 55. As shown in FIG. 4, the memory layer 60 could be deposited as a liner form without completely filling the second contact hole 55. A chalcogenide alloy, for example, an alloy of Ge—Sb—Te which is widely used for phase change material, could be used as a material for the memory layer 60.

Figure 5A:
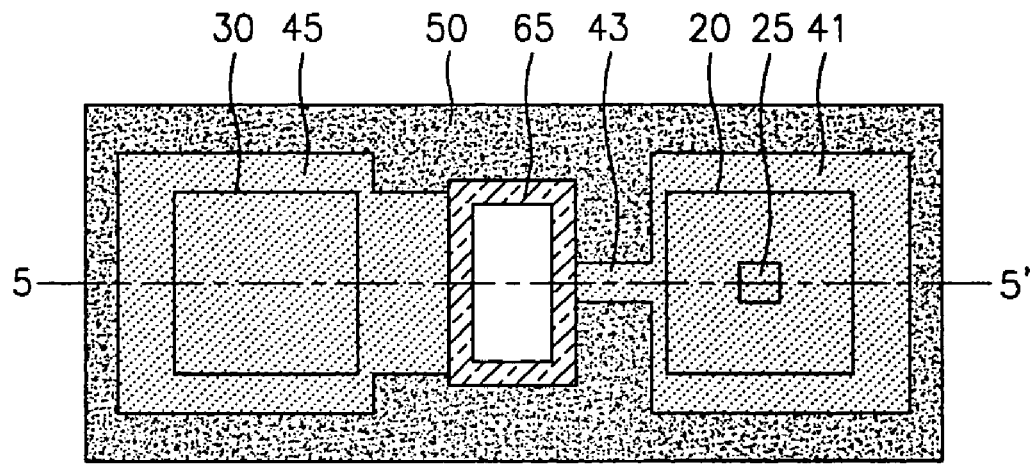
Figure 5B:
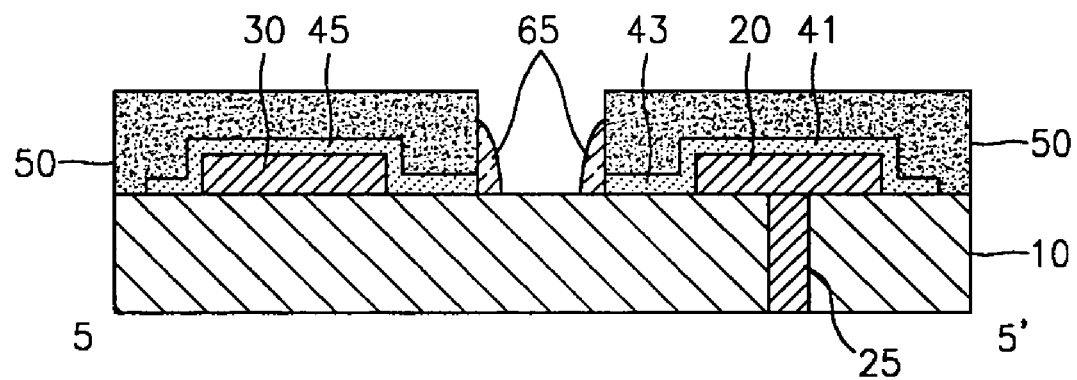

FIG. 5A is a plan view showing the step of patterning the memory layer pattern 65 and FIG. 5B is a cross sectional view according to the cutting-plane line 5–5' of FIG. 5A.

Referring to FIGS. 5A and 5B, the deposited memory layer 60 is extended over the second insulating layer 50 according to the characteristics of deposition; however, the patterning is performed to form a memory layer pattern 65 by a selective removal of such extended portion. For example, the memory layer 60 is etched back or CMP (chemical mechanical polishing) to form the memory layer pattern 65 as a ring shape on the side wall of the second contact hole 55 as shown in FIG. 5A. Also, such patterning may be performed by a photolithography process. Patterning by a combination of the CMP and photolithography processes enhances the uniformity of the shape of the memory layer pattern 65.

Figure 6:
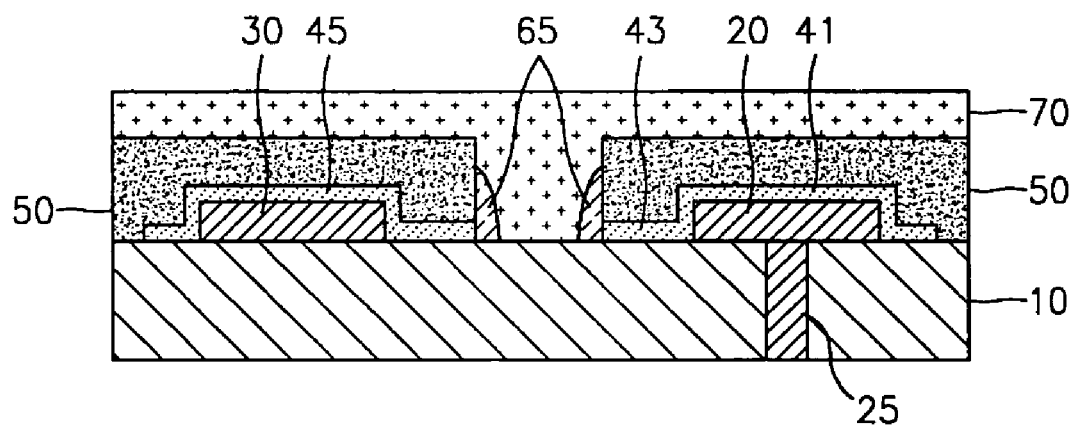

FIG. 6 is a cross-sectional view showing the step of forming a third insulating layer 70 on the memory pattern 65. As shown in FIG. 6, the third insulating layer 70, which is formed of a silicon oxide layer, is formed on the second insulating layer 50.

Figure 7A:
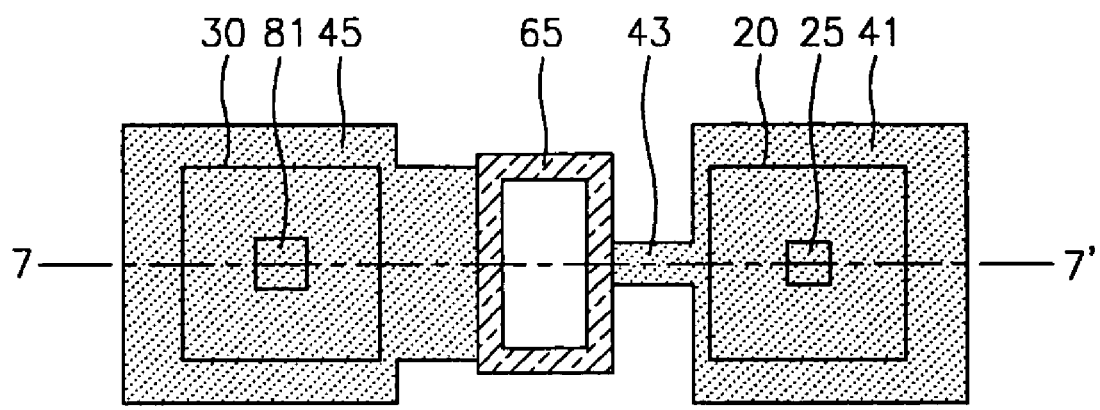
Figure 7B:
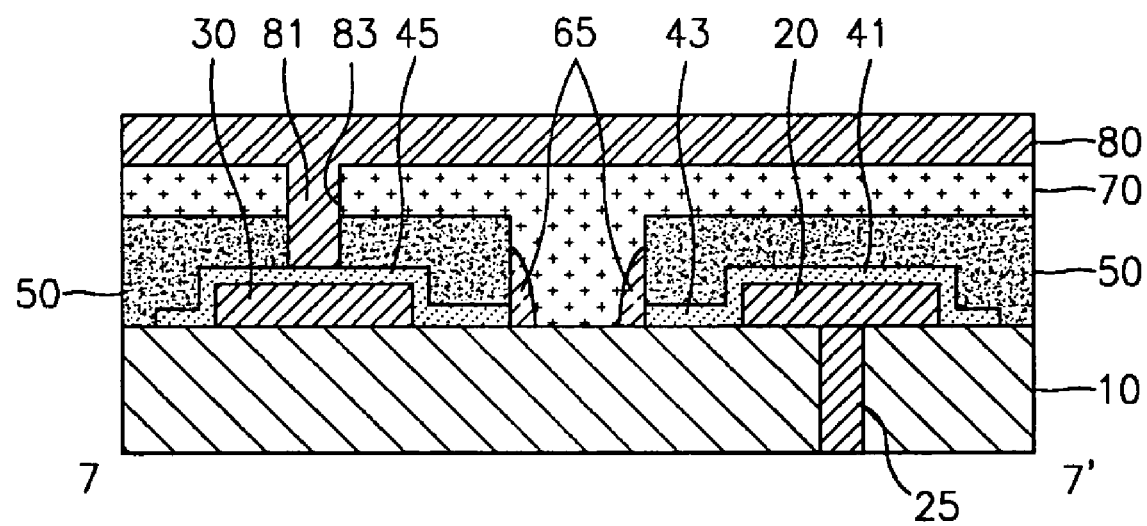

FIG. 7A is a plan view showing the step of forming an upper electrical line 80 connected to the second electrode 45, and FIG. 7B is a cross sectional view according to cutting-plane line 7–7' of FIG. 7A.

Referring to FIGS. 7A and 7B, through the third insulating layer 70, a third contact hole 83 is formed to expose the second electrode 45 selectively, and then an electric line layer filling the third contact hole 83 is deposited. Thereafter, the upper electric line 80 is connected electrically with the second electrode 45 through a second connecting contact 81 which is a portion filling the third contact hole 83. Here, the upper electric line 80 can be made of a conductive metal layer, such as aluminum (Al) or titanium tungsten (TiW).

As foregoing descriptions, a phase-change memory element can be formed by the process and steps according to the preferred embodiments of the present invention as suggested in FIGS. 7A and 7B, since the first electrode 41 and the second electrode 45 are formed with the same layer. A phase-change layer, that is, a memory layer pattern 65, which is located between the first electrode 41 and the second electrode 45, contacts a side surface of the relatively narrow width of the first electrode which is exposing to the side wall of the second contact hole 55. Accordingly, the contacting surface between the memory layer pattern 65 and the first electrode 41 is confined to the side surface of the narrow width of the first electrode 41. Because the first electrode 41 is actually used as a heating layer, the operation volume is substantially confined to the portion of the memory layer pattern 65 adjoining the side surface of the narrow width portion 43 of the first electrode 41.

The width of the narrow width portion 43 of the first electrode 41 is dependent on the photolithography process but the thickness substantially is dependent on the thickness of the deposition of the electrode layer 40 which is for the first electrode 41. At present time, the photolithography process has a limitation in patterning; however, the layer thickness by deposition can be achieved far beyond the limitation of the photolithography process, and has enabled the obtaining further thinner and better in uniformity. In other words, it is possible to control the thickness of the thin film much thinner than the width of the first electrode layer, and to achieve a higher uniformity. Therefore, the contacting surface of the memory layer pattern 65 with the narrow width portion 43 of the first electrode 41 can be very small and be controlled with very high uniformity.

Figure 8A:
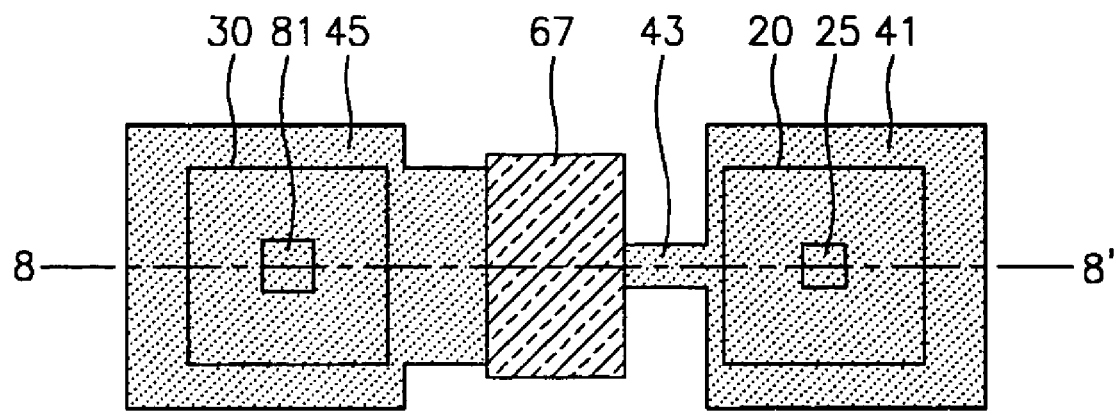
FIGS. 8A and 8B are general views of a phase-change memory device and the method of manufacturing thereof according to the second embodiment of the present invention.
Figure 8B:
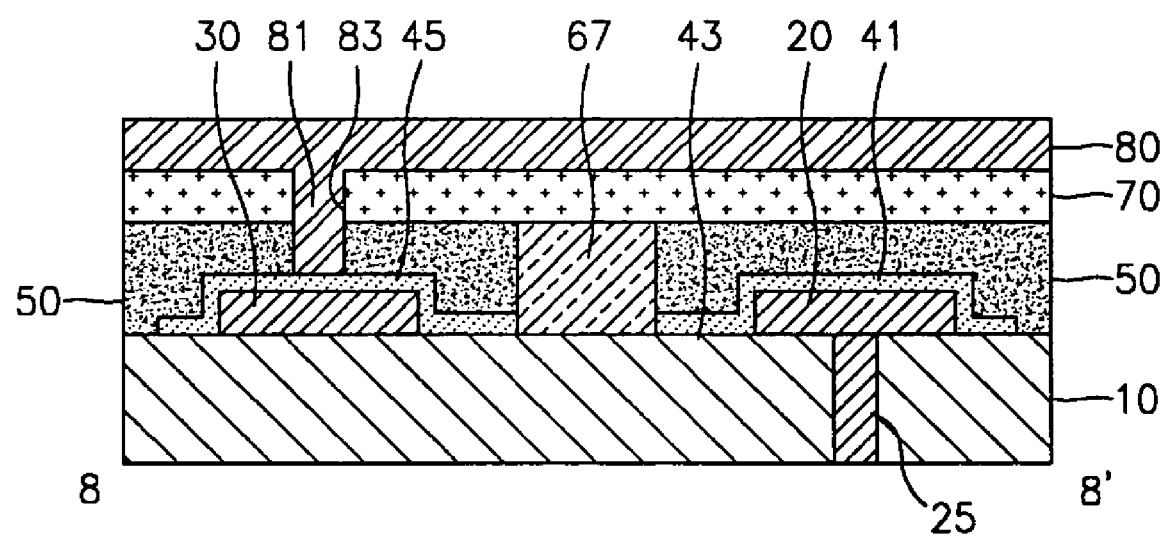

FIGS. 8A and 8B are the general views of a phase-change memory element and manufacturing method thereof according to the second embodiment of the present invention.

Referring to FIGS. 8A and 8B, as explained in FIGS. 3A and 3B according to the first embodiment, after separation of the first electrode 41 and the second electrode 45 is performed by the installation of the second contact hole 55, the memory layer can be formed by filling the second contact hole 55. Then, after flattening the upper surface of the memory layer using CMP process so as to expose the upper surface of the second insulating layer, a memory layer patterning 67 can be formed to completely fill the second contact hole 55. Besides above, there are various ways of forming a phase-change region, for example, patterning using the photolithography process after deposition of phase-change material, and the like. However, in all cases, the actual volume of a phase-change region is confined to the contact surface with the cross-section of the first electrode 41.

According to the embodiments of the present invention, in order to have very small volume of phase change region during operation, the phase change region can be confined to the contacting surface of the memory layer with the side surface of the first electrode which is used for heating layer. Since the area of the side surface of the first electrode depends on the thickness of the layer of the first electrode, it is possible to control the volume of a phase-change region in accordance with the thickness of the first electrode.

The thickness of a thin film can be controlled smaller size than the width formed by the photolithography process, and the thickness can be controlled with a higher uniformity. As a consequence, it is possible to manufacture a phase-change memory element capable of low power operation, and, especially, to manufacture a semiconductor substrate or wafer which has uniform characteristics as a whole.

Also, it is possible to minimize the number of masks required in the manufacturing process, thereby decreasing process costs, and it enables manufacture of a high integrated memory device.

This invention may, however, be embodied in many different forms and should not be construed as being limited to the embodiments set forth herein. Rather, these embodiments are provided so that this disclosure is thorough and complete and fully conveys the concept of the invention to those skilled in the art.

What is claimed is:

1. A phase-change memory element, comprising:
   a first electrode used as a heating layer;
   a second electrode laterally disposed adjacent to the first electrode, wherein a side surface of the first electrode faces a side surface of the second electrode; and
   a memory layer located between the side surfaces of the first electrode and the second electrode and made of a phase-change material contacting at least the side surface of the first electrode.

2. The phase-change memory element of claim 1, wherein the first electrode and the second electrode are formed of same material.

3. The phase-change memory element of claim 1, wherein the first electrode is made of a material selected from the group consisting of titanium aluminum nitride, titanium silicon nitride, and titanium carbon nitride.

4. The phase-change memory element of claim 2, wherein the first electrode and the second electrode have the same thickness and have the same height.

5. The phase-change memory element of claim 1, wherein the first electrode has a narrow width portion protruding toward the side surface of the second electrode located opposite to the first electrode and contacting the memory layer.

6. The phase-change memory element of claim 1, wherein chalcogenide alloy is used as the phase-change material.

7. The phase-change memory element of claim 1, wherein the memory layer is formed in a ring shape with two opposite surfaces contacting the side surfaces of the first electrode and the second electrode, respectively.

8. The phase-change memory element of claim 1, further comprising:
   a first interconnection contact connecting the first electrode to a semiconductor substrate electrically; and
   a second interconnection contact connecting the second electrode to an upper electric line electrically.

9. The phase-change memory element of claim 8, further comprising:
   a first electrode pad being between the first electrode and the first interconnecting contact and having a thicker thickness than the first electrode; and
   a second electrode pad having the same height and thickness as the first electrode pad under the second electrode.

10. A method of manufacturing a phase-change element, comprising:
    forming an electrode layer pattern on a first insulating layer;
    forming a second insulating layer covering the electrode layer pattern;
    forming a contact hole, through the second insulating layer and the electrode layer pattern dividing the electrode layer pattern into a first electrode, which is used as a heating layer, and a second electrode layer, which is laterally opposite to the first electrode; and forming a memory layer with a phase-change material contacting the side surfaces of the first electrode and the second electrode, which are exposed by the contact hole, in the contact hole.

11. The method of claim 10, wherein the forming the electrode layer pattern comprises:

forming the electrode layer pattern on the first insulating layer; and patterning the electrode layer so that a portion of the electrode layer pattern between the first electrode and the second electrode to the first electrode layer side has a narrower width than that of the second electrode; and the contact hole is formed through the narrowed width portion and allows the exposed surface of the narrow width portion to contact with the memory layer at the contact hole wall.

12. The method of claim 11, further comprising:

forming a first electrode pad and a second electrode pad, respectively aligned to the first electrode and the second electrode, on the first insulating layer prior to the formation of the electrode layer.

13. The method of claim 12, wherein the forming the first electrode pad and the second electrode pad comprises:

forming an electrode layer on the first insulating layer; and patterning the electrode layer to form the first electrode pad and the second electrode pad.

14. The method of claim 11, further comprising:

forming an interconnection contact, which electrically connects a semiconductor substrate thereunder, and the first electrode through the first insulating layer prior to the formation of the electrode layer.

15. The method of claim 10, wherein the forming the memory layer comprises:

forming the memory layer at least contacting the side wall of the contact hole; and patterning the memory layer by a CMP process to expose the upper surface of the second insulating layer.

16. The method of claim 10, the forming the memory layer comprises:

forming the memory layer at least contacting the side wall of the contact hole and following the profile of the perimeter of the contact hole; and patterning the memory layer to have a ring shape on the wall of the contact hole that exposes the bottom of the contact hole.

17. The method of claim 13, the forming the memory layer comprises:

patterning the memory layer by etching back the memory layer.

18. The method of claim 10, further comprising:

forming a third insulating layer on the second insulating layer; and forming an upper electric line on the third insulating layer to electrically connect to the second electrode after forming the memory layer.

* * * * *